United States Patent
Watanabe et al.

(10) Patent No.: US 7,476,942 B2
(45) Date of Patent: Jan. 13, 2009

(54) SOI LATERAL SEMICONDUCTOR DEVICE AND METHOD OF MANUFACTURING THE SAME

(75) Inventors: Yasumasa Watanabe, Matsumoto (JP); Hideaki Teranishi, Hachioji (JP); Naoto Fujishima, Matsumoto (JP)

(73) Assignee: Fuji Electric Device Technology Co., Ltd. (JP)

( * ) Notice: Subject to any disclaimer, the term of this patent is extended or adjusted under 35 U.S.C. 154(b) by 15 days.

(21) Appl. No.: 11/697,733

(22) Filed: Apr. 8, 2007

(65) Prior Publication Data

US 2007/0235804 A1    Oct. 11, 2007

(30) Foreign Application Priority Data

Apr. 10, 2006 (JP) ............................. 2006-107596

(51) Int. Cl.
*H01L 29/06* (2006.01)
(52) U.S. Cl. ................ 257/370; 257/368; 257/E29.027
(58) Field of Classification Search ................ 257/368, 257/370, E29.027
See application file for complete search history.

(56) References Cited

U.S. PATENT DOCUMENTS

| 5,438,220 | A | 8/1995 | Nakagawa et al. |
| 5,463,241 | A | 10/1995 | Kubo |
| 5,567,629 | A | 10/1996 | Kubo |
| 7,417,296 | B2* | 8/2008 | Akiyama ..................... 257/500 |
| 2005/0258461 | A1* | 11/2005 | Wang et al. ................. 257/288 |
| 2006/0086998 | A1* | 4/2006 | Nagaoka ..................... 257/500 |
| 2006/0118860 | A1* | 6/2006 | Hatade ........................ 257/328 |

FOREIGN PATENT DOCUMENTS

| JP | 06-318714 A | 11/1994 |
| JP | 7-122750 A | 5/1995 |
| JP | 08-064687 A | 3/1996 |
| JP | 8-506936 A | 7/1996 |
| JP | 2000-357665 A | 12/2000 |
| JP | 2003-303828 A | 10/2003 |
| WO | 95/16278 A1 | 6/1995 |

* cited by examiner

*Primary Examiner*—Victor A Mandala
(74) *Attorney, Agent, or Firm*—Rossi, Kimms & McDowell, LLP

(57) ABSTRACT

The SOI lateral semiconductor device includes a semiconductor region of a first conductivity type, a buried oxide film layer in the semiconductor region, a thin active layer on the buried oxide film layer, an anode region in the thin active layer, and a drain layer contacting the buried oxide film layer for confining the minority carriers injected from the anode region to the thin active layer within the thin active layer and for forming a structure that sustains a high breakdown voltage. The SOI lateral semiconductor device can provide a high breakdown voltage and low switching losses using the thin buried oxide film, which can be formed by an implanted oxygen (SIMOX) method.

20 Claims, 12 Drawing Sheets

SOI LATERAL SEMICONDUCTOR DEVICE AND METHOD OF MANUFACTURING THE SAME

BACKGROUND

Recently, developments of semiconductor apparatuses that incorporate semiconductor devices exhibiting different functions into one chip and realize higher functions using a dielectric separation technique have been explored vigorously. In particular, apparatuses that incorporate power semiconductor devices therein have been realized by combining various process techniques, such as a trench formation technique, an oxide film burying technique, a silicon epitaxial growth technique, and a surface smoothing techniques including a chemical mechanical polishing (CMP) technique. The apparatuses formed by the combination of these techniques include a switching power supply that incorporates a control IC and power semiconductor devices into a unit, a Bi-CMOS apparatus formed by combining the trench separation techniques, and an apparatus, comprised of a MOSFET and a thyristor, that exhibits composite functions.

In the field of power supply IC, a switching power supply that uses one chip IC, into which power semiconductor devices exhibiting a high breakdown voltage and a control IC are incorporated, has been used widely by virtue of its small size and light weight. The switching power supply has been employed in portable equipments including a mobile telephone and a camera for the mobile telephone, a power supply for lights, a power supply for driving a motor, and such equipments. The maximum commercial AC power supply voltage is as high as 240V (effective value) worldwide. In this case, the peak voltage can be as high as 680 V. Therefore, it is necessary for the semiconductor apparatuses to exhibit a breakdown voltage of around 700 V as the rated voltage thereof.

Among the component parts for the switching power supply, a capacitor and a transformer occupy large areas. It is possible to reduce the sizes of the capacitor and transformer by increasing the frequency of the switching power supply. Therefore, a frequency in the range between 100 kHz and 200 kHz is used widely. For the power semiconductor device, the MOSFET exhibiting low switching losses and excellent process compatibility with the control IC is employed. Since the MOSFET is a majority carrier device that does not cause any conductivity modulation based on the minority carrier injection, the MOSFET exhibits a high ON-resistance.

The ON-resistance reduction techniques innovated recently, however, allow the MOSFET to reduce its ON-resistance. The ON-resistance reduction techniques include changing the conventional planar gate structure to a three-dimensional gate structure including trenches formed perpendicular to the semiconductor substrate surface to shorten the unit cell pitch and to increase the channel density. The ON-resistance reduction techniques also include forming a multilevel reduced-surface-electric-field structure (hereinafter referred to as "RESURF structure"). But the ON-resistance reduction techniques described above complicate the MOSFET structure and its manufacturing process. As a result, the throughput of non-defective products and the manufacturing costs are affected adversely.

The IGBT exhibits a self-arc-extinguishing function in the same manner as a MOSFET and a low ON-resistance in the same manner as a bipolar transistor. By virtue of the merits thereof, IGBTs are employed widely especially for high voltage and high current use. Although the IGBT ON-resistance is reduced by enhancing the conductivity modulation effects by injecting minority carriers from the anode region to the base region, the turn-off loss increases. In other words, a tradeoff relation exists between the ON-resistance and the turn-off loss. The carriers that diffuse out of the current path and do not contribute to the conductivity modulation increase the turn-off loss.

Recently, an IGBT that includes a silicon on insulator (SOI) structure has been used in practice. The SOI structure confines the carriers within a thin n-type silicon active layer by dielectric separation to reduce the switching losses of the IGBT. See published Japanese Patent Application Hei. 6 (1994)-318714, where, although the n-type silicon active layer and a buried oxide film (hereinafter referred to as a "BOX layer") divide the voltage, the BOX layer as thick as 1 to several μm is used to obtain a high breakdown voltage, since the n-type silicon active layer is 1 μm or thinner.

FIG. 13 schematically illustrates a cross-sectional view of the conventional SOI semiconductor device described in the above publication. As shown in FIG. 13, the SOI semiconductor device includes a voltage dividing structure, a first potential distribution improving structure, and a second potential distribution improving structure for obtaining a high breakdown voltage. The voltage dividing structure includes a thick BOX layer 52, several μm in thickness, formed on a semiconductor substrate 51 and beneath a p-type anode region 55, that divides the breakdown voltage. The first potential distribution improving structure reduces the edge curvature beneath an n-type cathode region 54 by changing the impurity concentration in multiple steps to prevent breakdown from occurring in the edge portion beneath the n-type cathode region 54. The second potential distribution improving structure uses a very resistive thin film 53 including one end connected to an anode electrode 57 formed on the p-type anode region 55 and the opposite end connected to a cathode electrode 56 formed on the n-type cathode region 54. The thick BOX layer 52 described above is usually expensive since it is formed by joining together silicon wafers, each having an oxide film thereon, and polishing one of the wafers. The very resistive polysilicon thin film 53 formed in the surface has reliability problems in the high temperature and high humidity environments.

Japanese Patent Application Hei. 7 (1995)-122750 discloses a structure that reduces the capacitance between the drain and source of a vertical MOSFET employing the separation by an implanted oxygen (hereinafter referred to as the "SIMOX") technique that facilitates forming a buried oxide film locally in an arbitrary region by implanting oxygen ions. The structure here does not necessarily focus its target of a structure for sustaining the breakdown voltage of lateral semiconductor devices.

Japanese Patent Application Hei. 8 (1996)-64687 discloses a semiconductor apparatus that facilitates high-speed operations without affecting the provision of a higher breakdown voltage by electrically connecting lateral MOSFETs spaced apart from each other by a SOI structure. The lateral MOSFETs are connected electrically to each other with a very resistive region disposed below a buried oxide film formed below the MOSFETs.

Japanese Patent Application 2003-303828 discloses a technique for forming a buried oxide film below the emitter region of a lateral bipolar transistor for realizing a high amplification factor and low base resistance simultaneously in the lateral bipolar transistor.

Japanese Patent Application 2000-357665 discloses a SIMOX method that facilitates forming a thin buried oxide film locally. Recently, the techniques for forming a thin buried oxide film by the SIMOX method have been advanced remarkably.

A SOI structure is obtained by the aforementioned SIMOX method that forms a thin buried oxide film by combining oxygen ion implantation and subsequent annealing. Therefore, SOI semiconductor devices have been obtained with low manufacturing costs. Nonetheless, since the buried oxide film formed by the SIMOX method is very thin, several hundreds nm or thinner, it is difficult to obtain a high breakdown voltage. Therefore, the SIMOX method is evaluated to be a method for forming a SOI oxide film suited mainly for obtaining a logic circuit IC exhibiting a low breakdown voltage.

In view of the foregoing, there remains a need for a SOI lateral semiconductor device that facilitates a high breakdown voltage while sustaining low switching losses even when the SOI lateral semiconductor device includes a thin buried oxide film formed therein by a SIMOX method. The present invention addresses this need.

SUMMARY OF THE INVENTION

The present invention relates to semiconductor devices such as lateral IGBTs having a SOI structure, and a method of manufacturing the same. Specifically, the present invention relates to SOI lateral semiconductor devices having a structure that facilitates a higher breakdown voltage and lower switching losses.

One aspect of the present invention is a SOI lateral semiconductor device. The device can include a semiconductor substrate of a first conductivity type, a buried insulator film in the semiconductor substrate, and a very resistive active layer of a second conductivity type on the buried insulator film. The buried insulator film insulates and separates a major portion of the active layer from the semiconductor substrate. The device can further include a first semiconductor region of the first conductivity type formed adjacent to a first end of the active layer and a second semiconductor region of the second conductivity type formed adjacent to a second end of the active layer. The second semiconductor region extends more deeply in the substrate than the buried insulator film. The device can further include a buffer region of the second conductivity type in the active layer. The buffer region is less electrically resistive than the active layer. The device can further include a third semiconductor region of the first conductivity type in the buffer region. The third semiconductor region extends from the surface of the buffer region toward the buried insulator film.

The device can further include a fourth semiconductor region of the second conductivity type in a surface portion of the first semiconductor region, a gate electrode over the first semiconductor region and extending between the fourth semiconductor region and the active layer with a gate oxide film beneath the gate electrode. The device can further include a metal electrode over and in contact with the third semiconductor region, a metal electrode over the fourth semiconductor region, and a metal electrode over and in contact with the second semiconductor region.

The buried insulator film can be 200 nm or less in thickness. The buried insulator film can be formed by implanting oxygen ions. The third semiconductor region can extend from the surface of the buffer region to the buried insulator film. The second semiconductor region can be in contact with the buried insulator film. Alternatively, the buried insulator film can be spaced apart from the first and second semiconductor regions.

The device further includes a fifth semiconductor region of the second conductivity type beneath the buried insulator film. A first end of the fifth region can be connected to the active layer and a second end thereof can be connected to the second semiconductor region. The fifth semiconductor region cab exhibits an impurity concentration gradient. The fifth semiconductor region can include a plurality of regions extending between the first and second semiconductor regions. The impurity concentrations in the plurality of regions are different from each other. The fifth semiconductor region can comprise a first region extending from the first semiconductor region, a second region extending from the second semiconductor region, and a third region extending between the first and second regions, with the impurity concentration in the third portion greater than in the first or second region. The first end of the fifth region can be in contact with the active layer and a second end in contact with the second semiconductor region.

Another aspect of the present invention is a method of forming the SOI lateral semiconductor device described above. The method can include providing the semiconductor substrate, forming the buried insulator film in the semiconductor substrate, forming the very resistive active layer on the buried insulator film, the buried insulator film insulating and separating a major part of the active layer from the semiconductor substrate, forming the first semiconductor region of the first conductivity type adjacent to the first end of the active layer, forming the second semiconductor region of the second conductivity type adjacent to the second end of the active layer, the second semiconductor region extending more deeply in the substrate than the buried insulator film, forming the buffer region in the active layer, the buffer region being less electrically resistive than the active layer, forming the third semiconductor region in the buffer region, the third semiconductor region extending from the surface of the buffer region toward the buried insulator film, forming the fourth semiconductor region in the surface portion of the first semiconductor region, forming the gate electrode over the first semiconductor region extending between the fourth semiconductor region and the active layer with the gate oxide film beneath the gate electrode, forming the metal electrode over and in contact with the third semiconductor region, forming the metal electrode over the fourth semiconductor region, and forming the metal electrode over and in contact with the second semiconductor region.

DETAILED DESCRIPTION

Now the invention will be described in detail hereinafter with reference to the accompanied drawings, which illustrate the preferred embodiments of a SOI lateral IGBT according of the invention.

Figure 1:
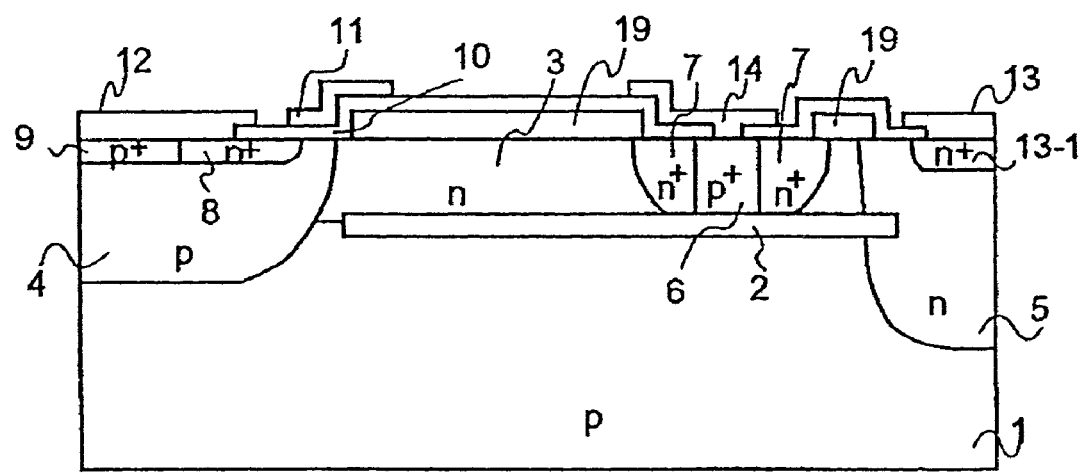
FIG. 1 schematically illustrates a cross-sectional view of a first embodiment of a SOI lateral IGBT according to the present invention.

Referring to FIG. 1, which schematically illustrates a cross-sectional view of a first embodiment of a SOI lateral IGBT, the IGBT has a SOI structure comprising a p-type silicon substrate 1, a buried oxide film layer (BOX layer) 2 50 nm thick in the p-type silicon substrate 1, and an n-type silicon active layer 3 around 0.8 μm thick formed on the BOX layer 2 and extending to the semiconductor chip surface. The silicon active layer 3 of n-type provides a very resistive thin film region working as a main current path of the IGBT. In the n-type silicon active layer 3, a p⁺-type anode region 6 extending from the semiconductor chip surface down to the BOX layer 2 and n⁺-type buffer regions 7 adjacent to the p⁺-type anode region 6 are formed.

At one end region of the BOX layer 2 (nearer the p⁺-type anode region 6 side of the n-type silicon active layer 3), an n-type well region 5 is formed more deeply than the BOX layer 2. At the opposite end of the n-type silicon active layer 3, a p-type well region 4 is formed more deeply than the BOX layer 2. The well region 4 of p-type and the n-type silicon active layer 3 can be in contact with each other without any problem. In the surface portion of the p-type well region 4, an n⁺-type emitter region 8 and a p⁺-type region 9 are formed such that the n⁺-type emitter region 8 and the p⁺-type region 9 are formed side by side in contact with each other. On the n⁺-type emitter region 8 and the p⁺-type region 9, a cathode electrode 12 is formed. Above the p-type well region 4, a gate electrode 11 is formed over the n⁺-type emitter region 8 and the active layer 3, with a gate oxide film 10 of 25 nm in thickness underneath the gate electrode 11. The gate electrode 11 extends over between the n⁺-type emitter region 8 and the active layer 3. An anode electrode 14 is formed over and in contact with the p⁺-type anode region 6. In the surface portion of the n-type well region 5, an n⁺-type contact region 13-1 is formed. A drain electrode 13 is formed on the n⁺-type contact region 13-1.

The n-type well region 5, which contacts the BOX layer 2, confines the minority carriers injected from the p⁺-type anode region 6 to the n-type silicon active layer 3 within the n-type silicon active layer 3, and forms a structure that sustains a high breakdown voltage. The configuration described above provides holes injected from the p⁺-type anode region 6 into the n-type silicon active layer 3, which holes vanish in the n-type well region 5. The SOI lateral semiconductor device thus reduces its switching losses by preventing the holes injected into the n-type active layer 3 from diffusing into the p-type semiconductor substrate 1.

Figure 2A:
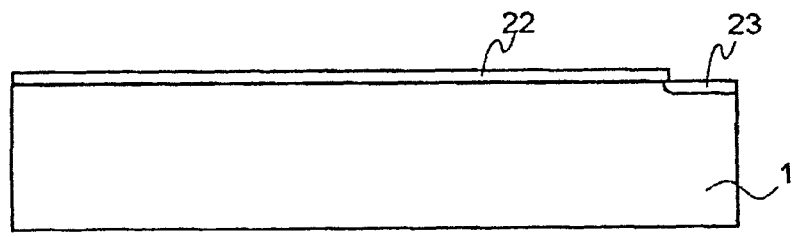
FIGS. 2A-2H schematically illustrate cross-sectional views of a wafer during wafer processing steps of manufacturing the SOI lateral IGBT of FIG. 1.
Figure 2B:
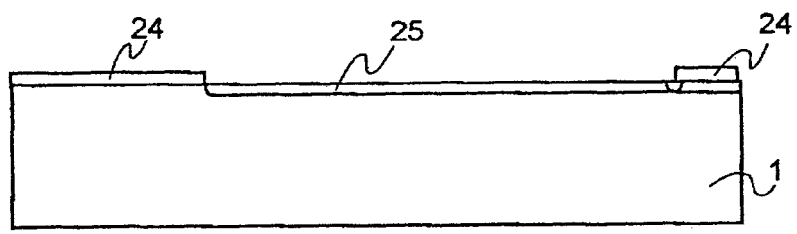

Referring to FIGS. 2A-2H, which schematically illustrate cross-sectional views of a wafer during the wafer process steps of manufacturing the SOI lateral IGBT of FIG. 1, for forming the deep n-type well region 5 and the BOX layer 2 of 50 nm thick simultaneously, a mask 22 for ion implantation is formed on the p-type silicon substrate 1, the impurity concentration therein being $1 \times 10^{14}$ cm$^{-3}$, through the photoprocess. A phosphorus ion implantation region 23 is formed by implanting phosphorus ions at the dose of $3.5 \times 10^{11}$ cm$^{-2}$ under the implantation energy of 50 keV (FIG. 2A). Then, a mask 24 for ion implantation is formed (after removing the mask 22) and an oxygen ion implantation region 25 is formed by implanting oxygen ions at the dose of $5 \times 10^{17}$ cm$^{-2}$ under the implantation energy of 180 keV (FIG. 2B).

Figure 2C:
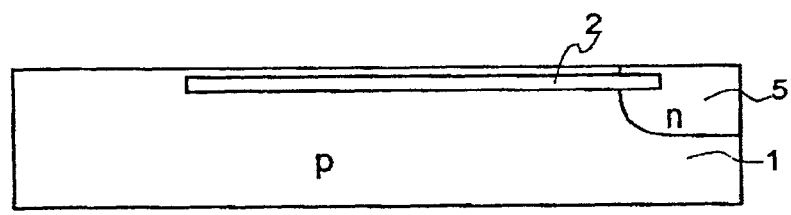
Figure 2D:
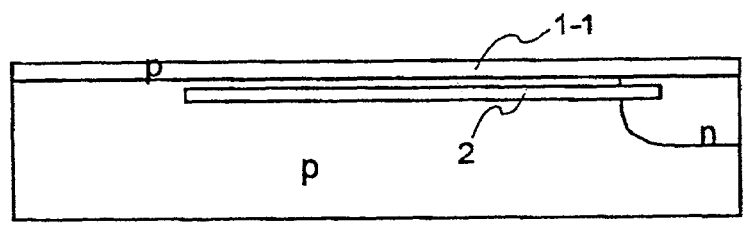
Figure 2E:
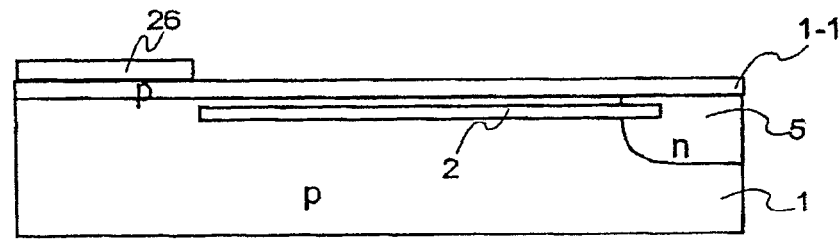

Then, (after removing the mask 24) the n-type well region 5 and the BOX layer 2 are formed simultaneously by thermally treating (annealing) the wafer at 1350° C. for 2 hr (FIG. 2C). The surface impurity concentration of the n-type well region 5 is $2 \times 10^{15}$ cm$^{-3}$ and the junction depth thereof is 14.5 μm. The BOX layer 2 is located at the depth of 0.3 μm from the wafer surface, 50 nm thick, and in contact with the n-type well region 5 at one end thereof. Then, a p-type silicon layer 1-1, with the impurity concentration thereof of $1 \times 10^{14}$ cm$^{-3}$ and the thickness thereof of 0.5 μm, is epitaxially grown at the substrate temperature of 900° C. (FIG. 2D). Then, for forming the n-type silicon active layer 3, phosphorous ions are implanted using a mask 26 at the dose of $1.5 \times 10^{12}$ cm$^{-2}$ under the implantation energy of 50 keV (FIG. 2E).

Figure 2F:
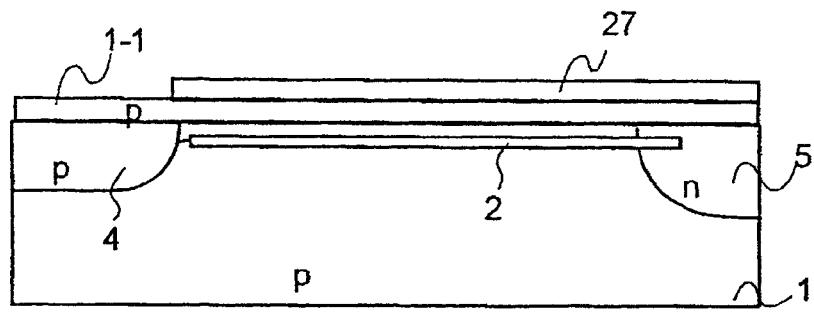

Then, boron ions are implanted using a mask 27 (after removing the mask 26) at the dose of $3.5 \times 10^{11}$ cm$^{-2}$ under the implantation energy of 50 keV (FIG. 2F). Then, the mask 27 is removed and a nitride film 28 is formed on the entire wafer surface. Then, the wafer is treated thermally (annealed) at 1150° C. for 400 min using the nitride film as a protector film while forming the p-type well region 4 and the n-type silicon active layer 3. The surface impurity concentration of the p-type well region 4 is $5 \times 10^{15}$ cm$^{-3}$ and the junction depth thereof is 7.5 μm. The impurity concentration of the n-type silicon active layer 3 is $3 \times 10^{14}$ cm$^{-3}$ and the thickness thereof is 0.8 μm.

Figure 2G:
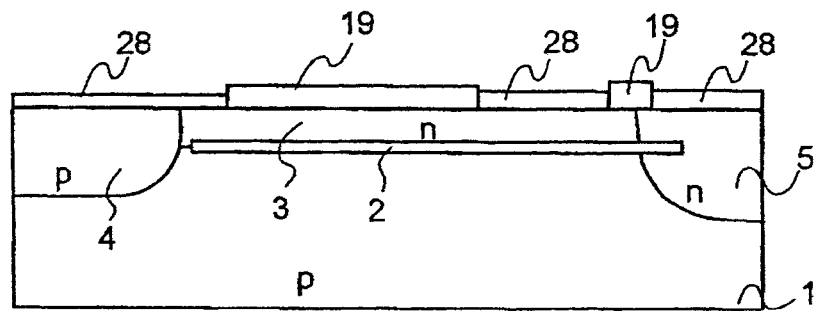
Figure 2H:
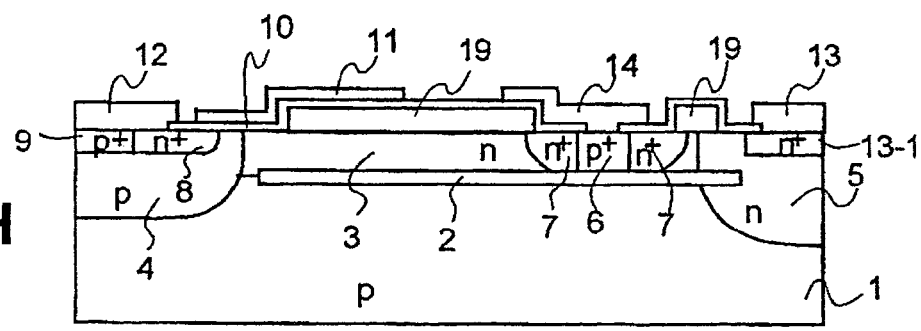

Then, a LOCOS oxide film 19 of 0.6 μm in thickness is formed by selective oxidation using the nitride film 28 patterned by photoetching the nitride film (FIG. 2G). After removing the nitride film 28, a gate oxide film 10, a p⁺-type anode region 6, an n⁺-type emitter region 8, an n⁺-type buffer region 7, contact regions 9 and 13-1, an anode electrode 14, a cathode electrode 12, a gate electrode 11, a drain electrode 13, and such constituent elements are formed using a conventional semiconductor manufacturing process, resulting in the lateral IGBT shown in FIG. 1 (FIG. 2H). The anode electrode 14 and the drain electrode 13 can be connected via wiring without any problem.

Now the operations of the SOI lateral semiconductor device having the structure described above will be described below with reference to FIG. 1. When a positive voltage higher than the threshold voltage is applied to gate electrode 11 in the state where the cathode electrode 12 is grounded and a positive voltage is applied to the anode electrode 14 and the drain electrode 13, an inversion layer (channel layer not shown) is formed in the surface portion of the p-type well region 4 beneath the gate oxide film 10. The electrons supplied from the cathode electrode 12 are fed to the $n^+$-type buffer region 7 via the $n^+$-type emitter region 8, the inversion layer (channel layer), and the n-type silicon active layer 3. The electrons work as the base current of a pnp transistor comprised of the $p^+$-type anode region 6, the $n^+$-type buffer region 7, the n-type silicon active layer 3, the p-type well region 4, and the $p^+$-type region 9, turning on the pnp transistor. Holes are injected from the $p^+$-type anode region 6 and led to the cathode electrode 12 through the path opposite of the above-described electron path.

The conductivity modulation in the IGBT is controlled by adjusting the hole amount injected from the $p^+$-type anode region 6. More specifically, the conductivity modulation in the IGBT is controlled by changing the ratio of the impurity concentration in the $p^+$-type anode region 6 and the impurity concentration in the $n^+$-type buffer region 7. For example, the ON-resistance is reduced by increasing the impurity concentration in the $p^+$-type anode region 6. As the potential of the gate electrode 11 is lowered, the inversion layer vanishes and the electron injection stops. The holes in the n-type silicon active layer 3 are ejected via the cathode electrode 12 and the electrons from the anode electrode 14. As a result, the semiconductor device is turned off.

Since the switching loss energy is converted to heat, the device temperature rises, affecting the electrical characteristics adversely. As the switching frequency becomes higher, more adverse effects occur, further adversely affecting the device characteristics. Therefore, it is desirable for the switching losses to be low as possible. For the sake of downsizing, it is also desirable for the switching power supply to operate at a higher frequency.

For meeting the contradictory requirements, it is desirable for the switching power supply to reduce the switching losses (turn-off losses) of the device, as well as to reduce the ON-losses by reducing the ON-resistance of the device. Generally in the device including an n-type silicon active layer structure not exhibiting any carrier confinement function, the energy for ejecting the carriers that diffuse outside the n-type silicon active layer is additionally required. Therefore, the turn-off losses tend to increase. Moreover, the carriers that diffuse out of the n-type silicon active layer do not contribute to reducing the ON-resistance.

Figure 3:
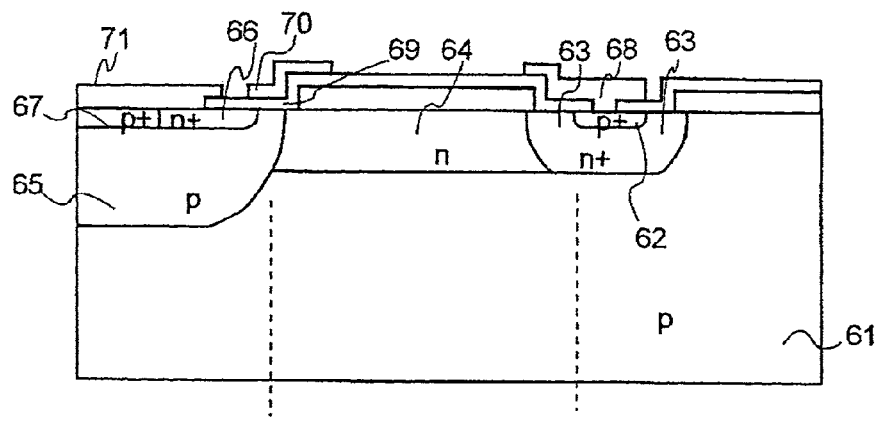
FIG. 3 schematically illustrates a cross-sectional view of a conventional lateral IGBT, which does not have any BOX layer, used for simulating the switching losses.

Referring to FIG. 3, which schematically illustrates a cross-sectional view of a conventional lateral IGBT, which does not have any BOX layer, for simulating the switching losses, the channel width is set at 11000 nm. The losses are compared by simulations between the SOI lateral IGBT having the BOX layer 2 according to the first embodiment shown in FIG. 1 and the conventional lateral IGBT not having any BOX layer shown in FIG. 3. The conventional lateral IGBT shown in FIG. 3 includes a p-type silicon substrate 61, an n-type silicon active layer 64 in the surface portion of the p-type silicon substrate 61, an $n^+$-type buffer region 63 in the end portion of the n-type silicon active layer 64, a $p^+$-type anode region 62 in the surface portion of the $n^+$-type buffer region 63, and an anode electrode 68 above and in contact with the $p^+$-type anode region 62. At the opposite end of the n-type silicon active layer 64, a p-type well region 65 is formed more deeply than the n-type silicon active layer 64. In the surface portion of the p-type well region 65, an $n^+$-type emitter region 66 and a $p^+$-type contact region 67 are formed. A cathode electrode 71 is formed on the $n^+$-type emitter region 66 and the $p^+$-type contact region 67. A gate electrode 70 is formed above the p-type well region 65. The gate electrode 70 extends above from the $n^+$-type emitter region 66 into the n-type silicon active layer 64 with a gate oxide film 69 interposed between the p-type well region 65/n-type silicon active layer 64 and the gate electrode 70.

Figure 4:
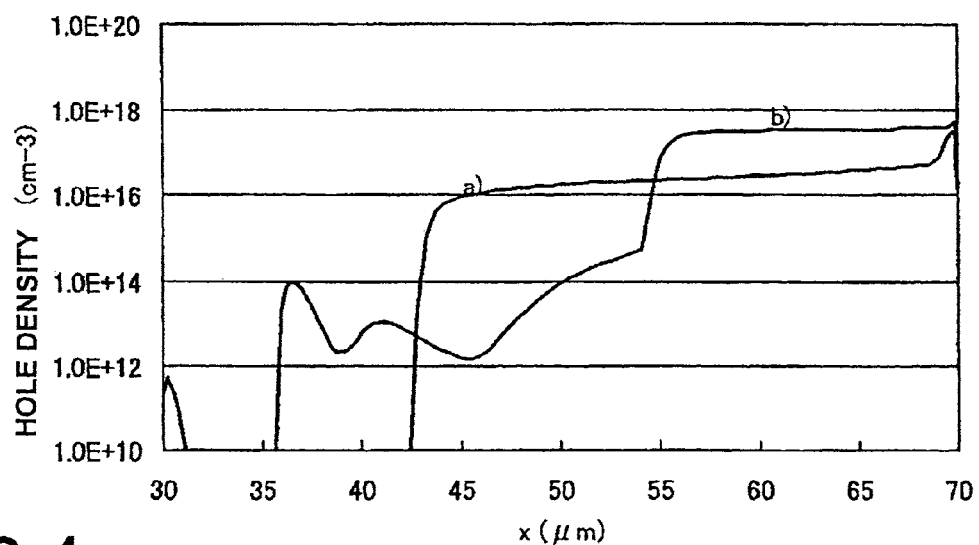
FIG. 4 illustrates hole density distributions obtained by simulating the transient characteristics at the time of switching.

FIG. 4 shows the hole density distributions obtained by simulating the transient characteristics at the time of turn-off. More specifically, FIG. 4 shows the spatial hole density distributions at the location 0.1 μm in depth from the surface of the n-type silicon active layer 3, 64 and 20 ns after removing the voltage applied to the gate electrode. The horizontal axis represents the distance X (μm) from the p-type well region 4 or 65 to the $p^+$-type anode region 6 or 62 and the vertical axis the hole density ($cm^{-3}$). The numerical expression on the vertical axis $1.0 E+20$ represents $1.0 \times 10^{20}$. The other numerical expressions on the vertical axis represent in the same manner as described above. The left hand side end coordinate X=30 μm corresponds to the anode side edge of the p-type well region 4, 65. The right hand side end coordinate X=70 μm corresponds to the $n^+$-type emitter side edge of the $p^+$-type anode region 6, 62.

In FIG. 4, graph a) represents the hole distribution in the IGBT not having any BOX layer (FIG. 3) and graph b) the hole distribution in the IGBT including the BOX layer 2 (FIG. 1). The hole distribution graph a) in the IGBT not having any BOX layer indicates that the holes that have scattered due to the diffusion thereof to the substrate 61 remain unsweepable out of the region between the edge of the $p^+$-type anode region 62 (X=70 μm) and the position spaced apart for 27 μm from the edge of the $p^+$-type anode region 62 (i.e., the region between X=70 μm and 43 μm). In contrast, the hole distribution graph b) in the IGBT according to the first embodiment indicates that the holes remain in the anode side at a narrower region of 15 μm (i.e., the region between X=70 μm and 55 μm), further indicating the wider depletion layer expansion on the cathode side.

The IGBT not having any BOX layer exhibits the lowest ON-losses of $1.35 \times 10^{-6}$ J (Joule), since there exists a wide high-hole-density region. On the other hand, the IGBT not having any BOX layer exhibits a much larger turn-off losses of $3.0 \times 10^{-5}$ J. Therefore, the IGBT not having any BOX layer exhibits the total losses of $3.135 \times 10^{-5}$ J. The power at the driving frequency 100 kHz is $3.135 \times 10^{-5} \times 10^5 = 3.135$ W (Watt). The IGBT according to the first embodiment exhibits a larger ON-losses of $1.8 \times 10^{-6}$ J. The IGBT according to the first embodiment, however, exhibits greatly reduced turn-off losses of $3.5 \times 10^{-6}$ J. Therefore, the IGBT according to the first embodiment exhibits lower total losses of $5.3 \times 10^{-6}$ J. The power at the driving frequency 100 kHz is $5.3 \times 10^{-6} \times 10^5 = 0.53$ W. The breakdown voltage is 425 V for the conventional IGBT and 420 V for the IGBT according to the first embodiment. The switching losses in the IGBT according to the first embodiment are improved to be 0.53/3.135 times (that is about ⅙ times) lower than the switching losses in the conventional IGBT not having any BOX layer.

Figure 5:
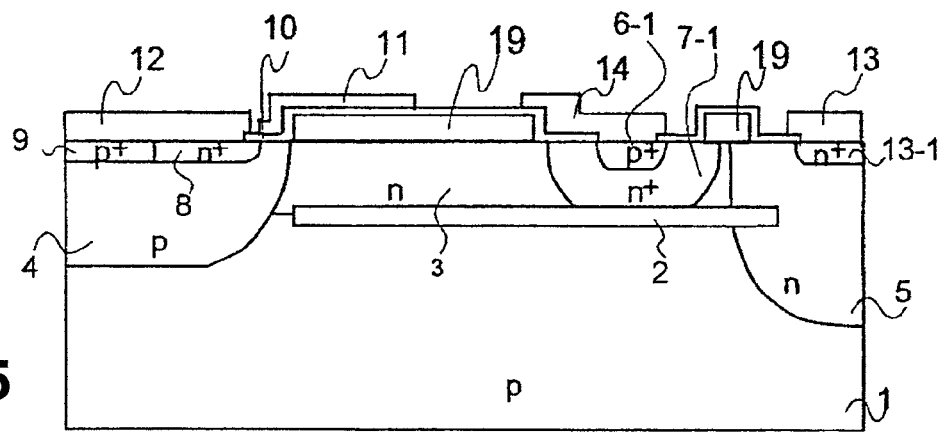
FIG. 5 schematically illustrates a cross-sectional view of a second embodiment of a SOI lateral IGBT according to the present invention.

FIG. 5 schematically illustrates a cross-sectional view of a second embodiment of a SOI lateral IGBT. The second embodiment is different from the first embodiment as follows. In the second embodiment, an $n^+$-type buffer region 7-1 is formed around a p+-type anode region 6-1, the depth of the p+-type anode region 6-1 is set to be about ⅓ of the depth of the n-type silicon active layer 3, and the n+-type buffer region 7-1 is positioned beneath the p+-type anode region 6-1 such that the n+-type buffer region 7-1 is between the p+-type anode region 6-1 and the BOX layer 2. In other words, the p+-type anode region 6-1 extends into the n+-type buffer region 7-1 from the surface region of the n+-type buffer region 7-1 toward the BOX layer 2, as opposed to extending to the BOX layer 2 as configured in the first embodiment.

The above described configuration is employed to reduce the amount of holes injected from the p+-type anode region 6-1 to the n+-type buffer region 7-1 by reducing the hole injection area between the p+-type anode region 6-1 and the n+-type buffer region 7-1 and to enhance the electron ejection from the n-type silicon active layer 3 to the n-type drain region 5 at the time of turn-off. The other constituent elements in FIG. 5 are same as those in FIG. 1.

The second embodiment exhibits the simulated ON-losses of $2.8 \times 10^{-6}$ J and the simulated turn-off losses of $1.4 \times 10^{-6}$ J. Therefore, the total losses are $4.2 \times 10^{-6}$ J, which is lower than the total losses of the first embodiment. The power at the driving frequency 100 kHz is $4.2 \times 10^{-6} \times 10^{5} = 0.42$ W. The breakdown voltage of the second embodiment is 420 V. The second embodiment thus further reduces the switching losses.

Figure 6:
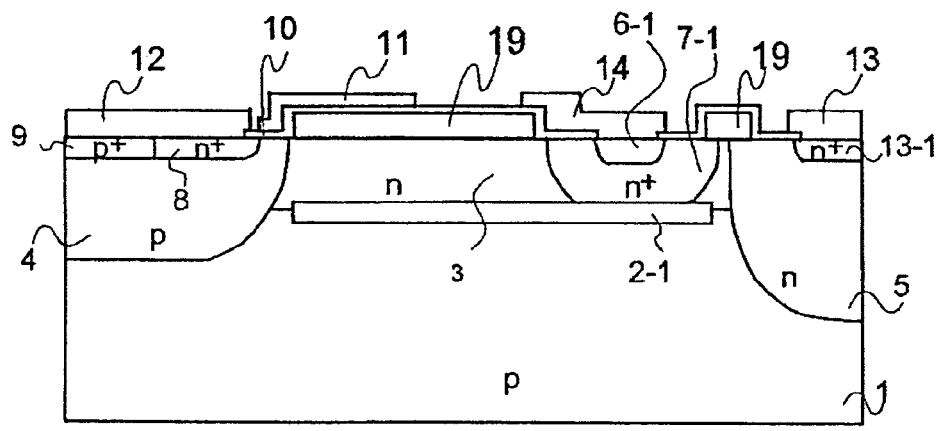
FIG. 6 schematically illustrates a cross-sectional view of a third embodiment of a SOI lateral IGBT according to the present invention.

FIG. 6 schematically illustrates a cross-sectional view of a third embodiment of a SOI lateral IGBT. The third embodiment is similar to the second embodiment, except that its BOX layer 2-1 is not in contact with the n-type well region (drain region) 5. Rather, it is spaced apart from the n-type well region 5. This configuration allows some carriers to diffuse between the BOX layer 2-1 and the n-type well region 5 to the substrate 1, thereby reducing the ON-losses by reducing the carriers remaining in the n-type silicon active layer 3. The other constituent elements in FIG. 6 are same as those in FIG. 5. The spacing between the n-type well region 5 and the right hand side edge of the BOX layer 2-1 is set at 1 μm. It is desirable for the spacing to be shorter than several μm.

The third embodiment exhibits the simulated ON-losses of $2.36 \times 10^{-6}$ J and the simulated turn-off losses of $1.93 \times 10^{-6}$ J. Therefore, the total losses are $4.29 \times 10^{-6}$ J, which is slightly higher than those of the second embodiment, but still lower than those of the first embodiment. The power at the driving frequency 100 kHz is $4.29 \times 10^{-6} \times 10^{5} = 0.429$ W. The breakdown voltage of the third embodiment, however, is 485 V, which is higher than the first and second embodiments. Although the turn-off losses increase in the third embodiment as compared to the second embodiment, the third embodiment is effective in improving the breakdown voltage.

Figure 7:
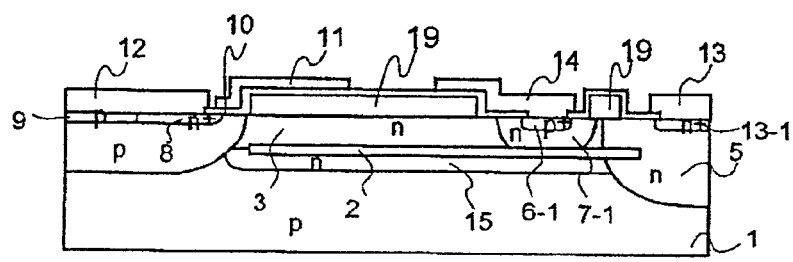
FIG. 7 schematically illustrates a cross-sectional view of a fourth embodiment of a SOI lateral IGBT according to the present invention.

FIG. 7 schematically illustrates a cross-sectional view of a fourth embodiment of SOI lateral IGBT. The fourth embodiment is similar to the second embodiment, except that it includes a region 15 formed beneath the BOX layer 2. The region 15 connects the n-type well region 5 and the p-type well region 4 to each other. In the fourth embodiment, a MOSFET including a source region comprised of the n+-type emitter region 8, a drift region comprised of the region 15, and a drain region comprised of the n-type drain region 5 is formed parallel to the IGBT.

The fourth embodiment exhibits the simulated ON-losses of $2.81 \times 10^{-6}$ J, the simulated turn-off losses of $1.47 \times 10^{-6}$ J, and, therefore, the total losses of $4.28 \times 10^{-6}$ J. The power at the driving frequency 100 kHz is $4.28 \times 10^{-6} \times 10^{5} = 0.428$ W. The breakdown voltage of the IGBT according to the fourth embodiment is 660 V, which is significantly higher than those of the first-third embodiments.

Figure 8A:
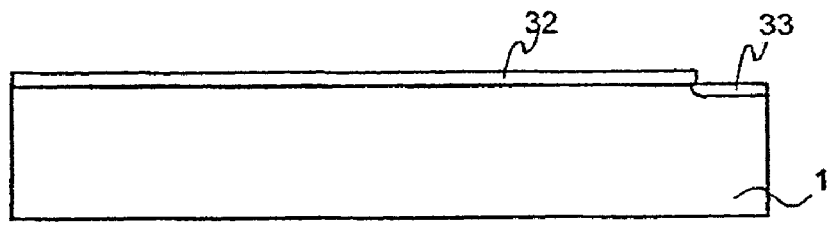
FIGS. 8A-8G schematically illustrate cross-sectional views of a wafer during wafer processing steps of manufacturing the SOI lateral IGBT of FIG. 7.
Figure 8B:
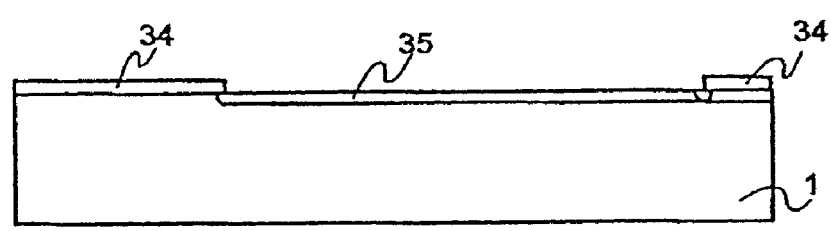
Figure 8C:
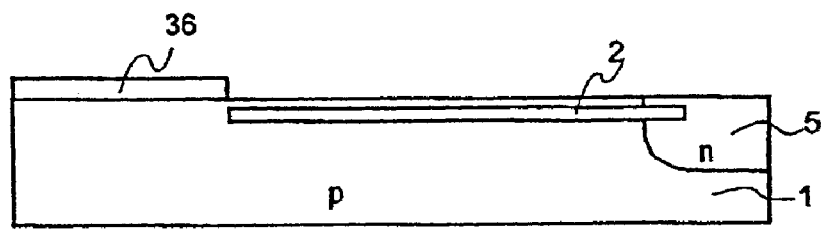
Figure 8D:
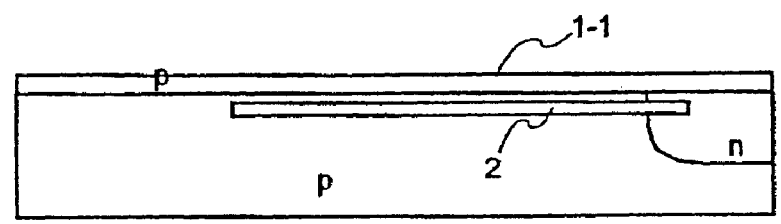

FIGS. 8A-8G schematically illustrate cross-sectional views of a wafer illustrating the manufacturing steps of manufacturing the SOI lateral IGBT of FIG. 7. First, for forming the deep n-type well region 5 and the BOX layer 2 50 nm thick simultaneously, a mask 32 for ion implantation is formed through the photoprocess on the p-type silicon substrate 1, the impurity concentration therein being $1 \times 10^{14}$ cm$^{-3}$. Phosphorus ions are implanted at the dose of $3.5 \times 10^{11}$ cm$^{-2}$ under the implantation energy of 50 keV to form a region 33 (FIG. 8A). Subsequently, a mask 34 for ion implantation is formed (after removing the mask 32) and oxygen ions are implanted at the dose of $5 \times 10^{17}$ cm$^{-2}$ under the implantation energy of 180 keV to form a region 35 (FIG. 8B). By thermally treating the wafer at 1350° C. for 120 min (after removing the mask 34), the n-type well region 5, with the surface impurity concentration thereof of $2 \times 10^{15}$ cm$^{-3}$ and the junction depth thereof of 14.5 μm, and the BOX layer 2 of 50 nm thick are formed (FIG. 8C). The BOX layer 2 is formed at the depth of 0.3 μm.

Then, a resist mask 36 is formed and phosphorus ions are implanted beneath the BOX layer 2 at the dose of $1.5 \times 10^{13}$ cm$^{-2}$ under the implantation energy of 160 keV to form the n-type silicon active layer 3 and the n-type region 15 (FIG. 8C). Then, p-type silicon layer 1-1, with the impurity concentration therein of $1 \times 10^{14}$ cm$^{-3}$ and the thickness thereof of 0.5 μm, is epitaxial grown at the substrate temperature of 900° C. (FIG. 8D) (after removing the resist mask 36).

Figure 8E:
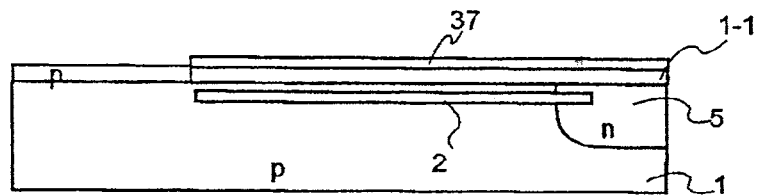
Figure 8F:
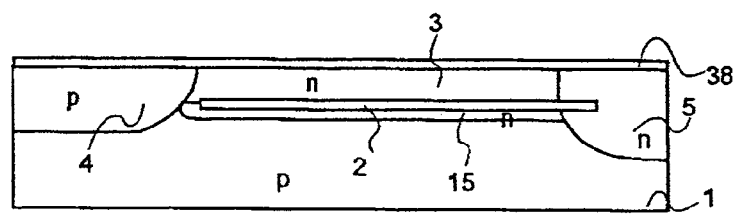
Figure 8G:
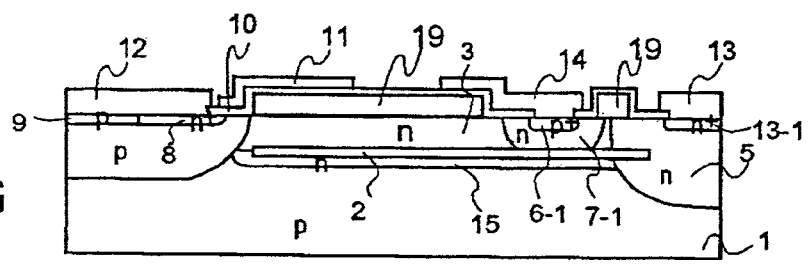

Then, a resist mask 37 is formed and boron ions are implanted at the dose of $3.5 \times 10^{11}$ cm$^{-2}$ under the implantation energy of 50 keV (FIG. 8E). After removing the mask 37, a nitride film 38 is formed on the entire wafer surface. Then, the n-type silicon active layer 3, the n-type well region 4, and the region 15 are formed by thermally treating the wafer at 1150° C. for 400 min using the nitride film 38 as a protector film (FIG. 8F). The impurity concentration in the n-type silicon active layer 3 is $3 \times 10^{14}$ cm$^{-3}$. The surface impurity concentration in the n-type well region 4 is $5 \times 10^{15}$ cm$^{-3}$ and the junction depth thereof is 7.5 μm. The surface impurity concentration in the region 15 is $3 \times 10^{14}$ cm$^{-3}$ and the junction depth thereof is about 5 μm.

A LOCOS oxide film 19 of 0.6 μm thick is formed using the nitride mask 38 formed by pattering the nitride film 38. Then, after removing the nitride film, the p+-type anode region 6-1, the n+-type buffer region 7-1, the n+-type emitter region 8, the contact regions 9 and 13-1, the gate electrode 11, the cathode electrode 12, the drain electrode 13, the anode electrode 14, and such constituent elements are formed using a conventional semiconductor process (FIG. 8G), resulting in the lateral IGBT according to the fourth embodiment shown in FIG. 7.

Figure 9:
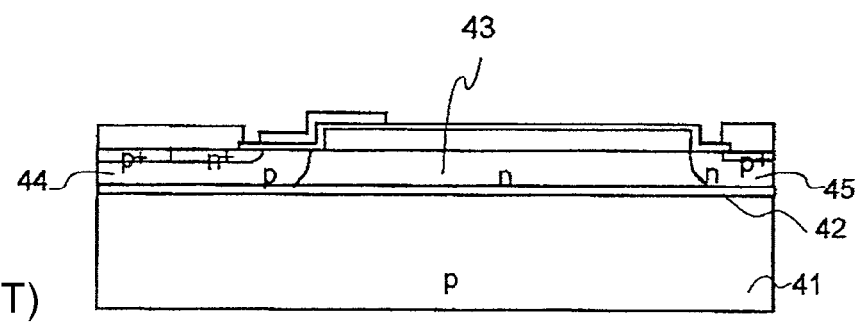
FIG. 9 schematically illustrates a cross-sectional view of a lateral IGBT having a conventional SOI structure.

FIG. 9 schematically illustrates a cross-sectional view of a lateral IGBT having a conventional SOI structure. The IGBT shown in FIG. 9 includes a BOX layer 42 formed in the entire major surface of a silicon substrate 41. On the BOX layer 42, an n-type silicon active layer 43 is formed. On one end portion of the n-type silicon active layer 43, an n-type well region (drain region) 45 is formed. On the opposite end portion of the n-type silicon active layer 43, a p-type well region 44 is formed. The BOX layer 42 located below the n-type well region (drain region) 45 and the p-type well region 44 insulates and separates the entire region between the n-type well region 45 and the p-type well region 44 from the substrate 41. In the conventional SOI structure described above, the breakdown voltage lowers as the BOX layer 42 becomes thinner. A simulation result indicates that the breakdown voltage of the semiconductor device having the conventional SOI structure is merely 80 V even when the BOX layer 42 is 100 nm thick.

In the SOI lateral semiconductor device shown in FIG. 7, however, a depletion layer expansion from the pn-junction between the n-type region 15 beneath the BOX layer 2 and the substrate 1 into the substrate 1 is realized in addition to the depletion layer expansions realized by the deep n-type well region 5 according to the first through third embodiments. The depletion layer expansions according to the first through third embodiments start from the pn-junction between the n-type well region 5 and the substrate 1 into the substrate 1 and from the pn-junction between the n-type silicon active layer 3 and the p-type well region 4 into the p-type well region 4.

The additional depletion layer expansion guide the lines of electric force in the direction perpendicular to the substrate 1 without localizing the lines of electric force that have entered the n-type active layer 3 in the BOX layer 2. A simulation result indicates that the breakdown voltage of the SOI lateral IGBT according to the fourth embodiment is 660 V even when the BOX layer 2 is merely 50 nm thick.

Figure 10:
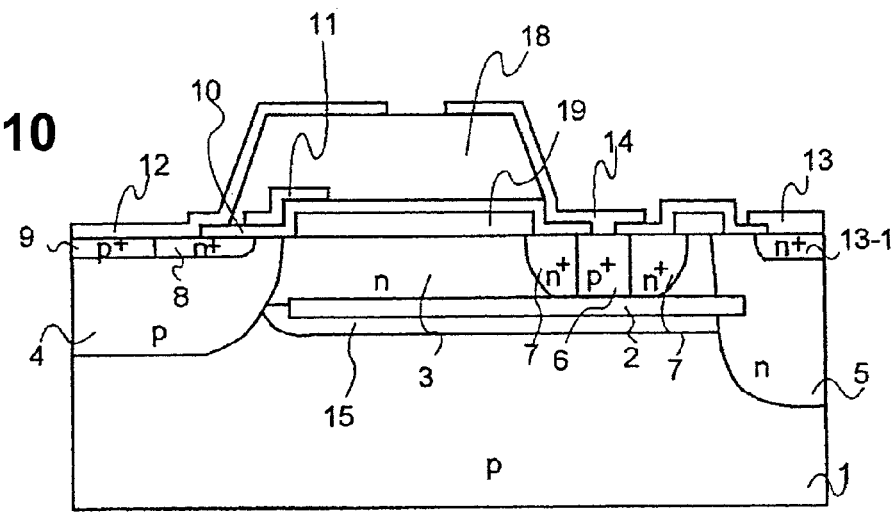
FIG. 10 schematically illustrates a cross-sectional view of a fifth embodiment of a SOI lateral IGBT according to the present invention.

FIG. 10 schematically illustrates a cross-sectional view of a fifth embodiment of a SOI lateral IGBT. The fifth embodiment facilitates further reduction of the switching losses thereof. In fifth embodiment is similar to the first embodiment with the n-type region 15 of the fourth embodiment formed below the BOX layer 2. Moreover, the fifth embodiment also includes an insulator film 18 of 8 μm thick formed over the n-type silicon active layer 3 and the gate electrode 11. Further, a field plate extending from the anode electrode 14 and a field plate extending from the cathode electrode 12 are formed on the insulator film 18. The field plates facilitate reduction of the electric field strengths in the vicinities of the respective electrodes and raise the electric field strength in the central part of the device. As a result, the hole ejection from the central part of the n-type silicon active layer 3 is sped up, the OFF-voltage rises faster, and the switching losses are further reduced in total, although a tail occurs in the current waveform falling toward zero. The other constituent elements in FIG. 10 are same as those of FIGS. 1 and 7.

The fifth embodiment exhibits the simulated ON-losses of $2.50 \times 10^{-6}$ J and the simulated turn-off losses of $1.45 \times 10^{-6}$ J. Therefore, the total losses are $3.95 \times 10^{-6}$ J. The power at the driving frequency 100 kHz is $3.95 \times 10^{-6} \times 10^5 = 0.395$ W. The breakdown voltage of the fifth embodiment is 640 V. The fifth embodiment facilitates reduction of the switching losses while preventing the breakdown voltage thereof from lowering.

Figure 11:
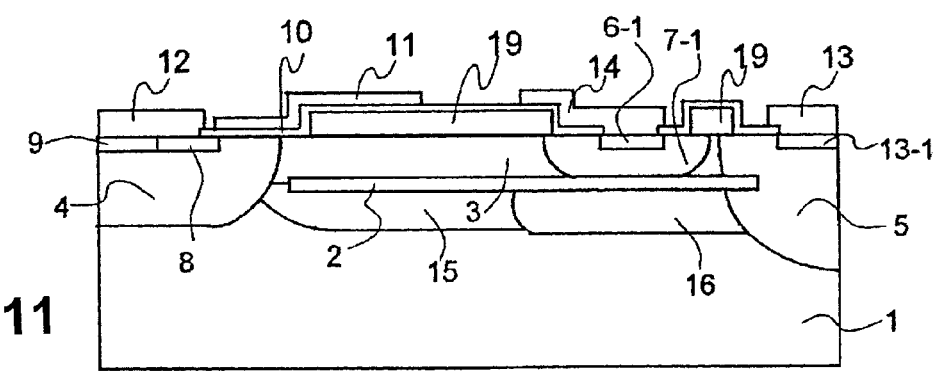
FIG. 11 schematically illustrates a cross-sectional view of a sixth embodiment of a SOI lateral IGBT according to the present invention.

FIG. 11 schematically illustrates a cross-sectional view of a sixth embodiment of a SOI lateral IGBT. The sixth embodiment is similar to the fourth embodiment, except that it further includes an n-type region 16 adjacent to the n-type region 15.

Figure 15A:
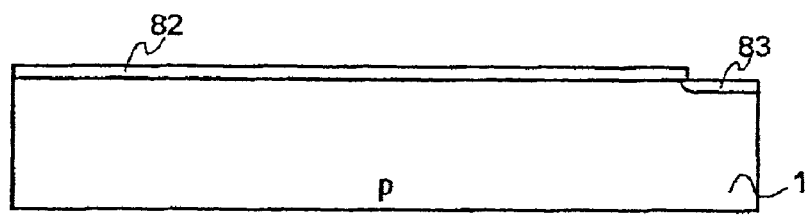
FIGS. 15A-15G schematically illustrate cross-sectional views of a wafer during the wafer processing steps of manufacturing the SOI lateral IGBT of FIG. 11.
Figure 15B:
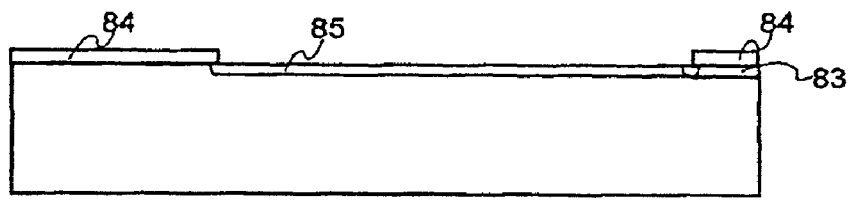

FIGS. 15A-15G schematically illustrate cross-sectional views of a wafer during the wafer process steps of manufacturing the SOI lateral IGBT of FIG. 11. First, for forming the deep n-type well region 5 and the BOX layer 2 of 50 nm thick simultaneously, a mask 82 for ion implantation is formed through the photoprocess on the p-type silicon substrate 1, the impurity concentration therein being $1 \times 10^{14}$ cm$^{-3}$. Then, a region 83 is formed by implanting phosphorus ions at the dose of $3.5 \times 10^{11}$ cm$^{-2}$ under the implantation energy of 50 keV (FIG. 15A). Then, a mask 84 (after removing the mask 82) for ion implantation is formed and a region 85 is formed by implanting oxygen ions at the dose of $5 \times 10^{17}$ cm$^{-2}$ under the implantation energy of 180 keV (FIG. 15B).

Figure 15C:
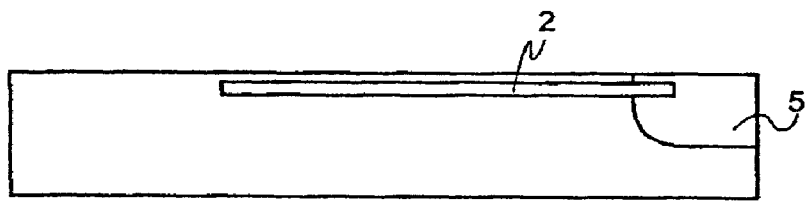
Figure 15D:
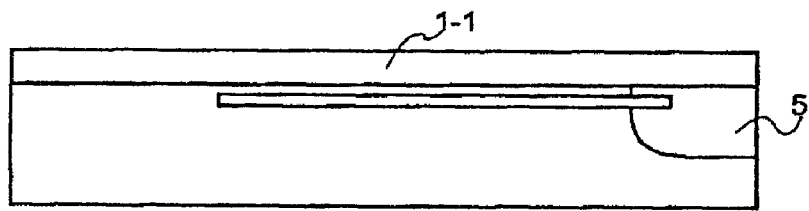
Figure 15E:
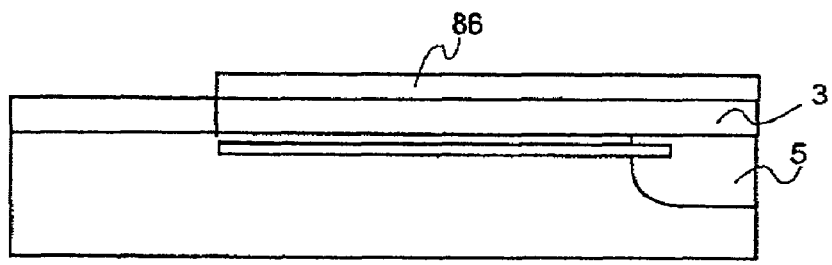

Then, the n-type well region 5, with the surface impurity concentration thereof of $2 \times 10^{15}$ cm$^{-3}$, and the BOX layer 2 of 50 nm thick are formed simultaneously by thermally treating the wafer at 1350° C. for 2 hour. The junction depth of the n-type well region 5 is 14.5 μm and the BOX layer 2 is located at the depth of 0.3 μm from the wafer surface (FIG. 15C). A mask (not shown) for ion implantation is formed through the photoprocess. Phosphorus ions are implanted at the dose of $8 \times 10^{12}$ cm$^{-2}$ under the implantation energy of 160 keV to the portion corresponding to the n-type region 15. Subsequently, phosphorus ions are implanted additionally at the dose of $4 \times 10^{12}$ cm$^{-2}$ to the portion corresponding to the n-type region 16. The p-type silicon layer 1-1, with the impurity concentration thereof of $1 \times 10^{14}$ cm$^{-3}$, is epitaxially grown to a thickness of 0.5 μm at the substrate temperature of 900° C. (FIG. 15D). A mask 86 (after removing the unillustrated mask) is formed and boron ions are implanted at the dose of $3.5 \times 10^{11}$ cm$^{-2}$ under the implantation energy of 50 keV (FIG. 15E).

Figure 15F:
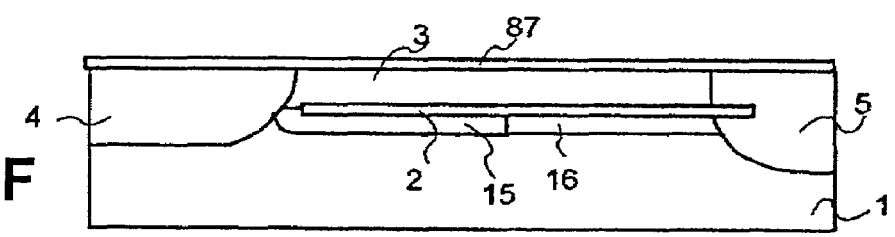

After removing the mask 86, a nitride film 87 is formed on the entire wafer surface. By thermally treating the wafer at 1150° C. for 400 min, the n-type silicon active layer 3, the p-type well region 4, the region 15, and the region 16 are formed (FIG. 15F). The impurity concentration of the n-type silicon active layer 3 is about $3 \times 10^{14}$ cm$^{-3}$ and the thickness thereof is 0.8 μm. The surface impurity concentration of the p-type well region 4 is about $5 \times 10^{15}$ cm$^{-3}$ and the junction depth thereof is 7.5 μm. The surface impurity concentration of the region 15 is about $2 \times 10^{14}$ cm$^{-3}$ and the junction depth thereof is about 4.5 μm. The surface impurity concentration of the region 16 is about $3 \times 10^{14}$ cm$^{-3}$ and the junction depth thereof is about 5 μm.

Figure 15G:
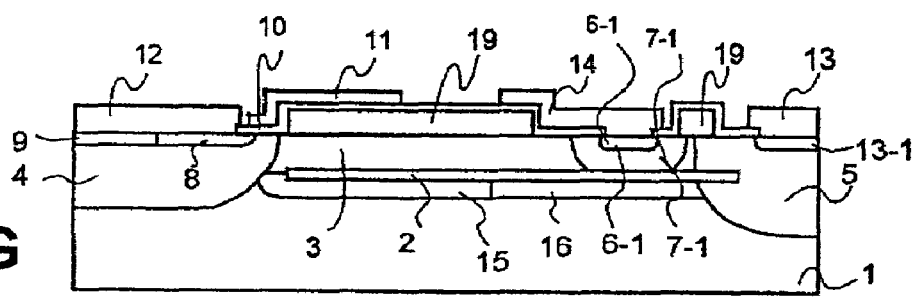

The nitride film 87 is patterned to form a nitride mask 87 and the LOCOS oxide film 19 0.6 μm thick is formed. Subsequently, the n$^+$-type emitter region 8, the p$^+$-type anode region 6-1, the n$^+$-type buffer region 7-1, the contact regions 9 and 13-1, the gate electrode 11, the cathode electrode 12, the drain electrode 13, the anode electrode 14, and such constituent elements are formed using a conventional semiconductor process, resulting in the SOI lateral IGBT according to the sixth embodiment shown in FIG. 11 (FIG. 15G).

The sixth embodiment exhibits the simulated ON-losses of $2.78 \times 10^{-6}$ J and the simulated turn-off losses of $1.45 \times 10^{-6}$ J. Therefore, the total losses are $4.23 \times 10^{-6}$ J. The power at the driving frequency 100 kHz is $4.23 \times 10^{-6} \times 10^5 = 0.423$ W. The breakdown voltage of the sixth embodiment is 672 V. As compared to the fourth embodiment, the sixth embodiment exhibits almost the same switching losses while improving the breakdown voltage by 12 V.

The thickness of the BOX layer 2 set at 50 nm is the minimum thickness allowed to form by controlling the oxygen ion implantation amount and the thermal treatment conditions in the SIMOX method. Alternatively, the BOX layer 2 can be as thick as several hundreds nm, which is the maximum thickness allowed to form by the SIMOX method.

Figure 12:
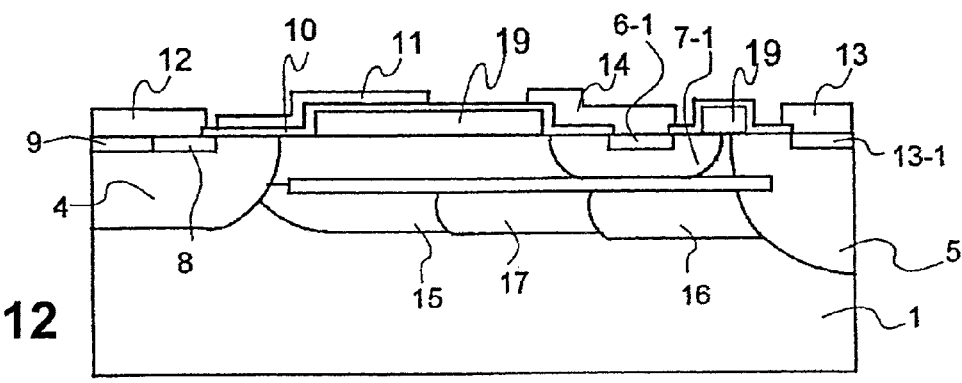
FIG. 12 schematically illustrates a cross-sectional view of a seventh embodiment of a SOI lateral IGBT according to the present invention.
Figure 13:
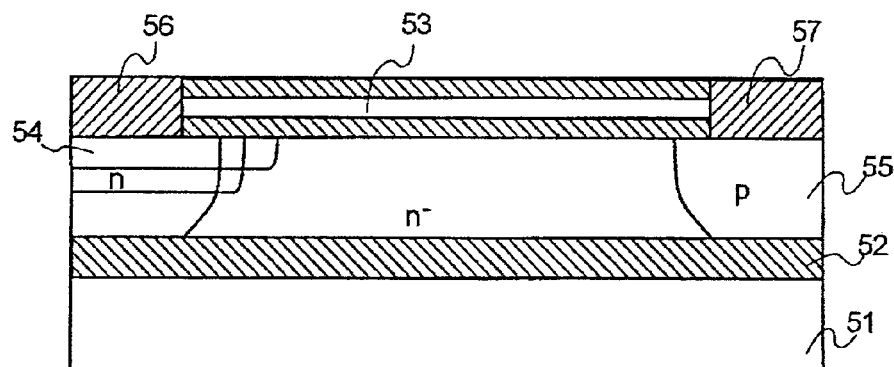
FIG. 13 schematically illustrates a cross-sectional view of a conventional SOI semiconductor device.

FIG. 12 schematically illustrates a cross-sectional view of a seventh embodiment of a SOI lateral IGBT. The seventh embodiment is similar to the sixth embodiment, except that it further includes a third RESURF region 17. That is, the impurity concentration distribution in the n-type RESURF region below the BOX layer 2 is different. In the seventh embodiment, the RESURF region is divided into three regions: a first RESURF region 15 on the side of the p-type well region 4, a second RESURF region 16 on the side of the n-type well region 5, and a third RESURF region 17 between the first and second RESURF regions 15 and 16. The surface impurity concentration in the third RESURF region 17 is set at $3 \times 10^{15}$ cm$^{-3}$, which is higher than the surface impurity concentration in the first and second RESURF regions 15 and 16, which is set at $2 \times 10^{15}$ cm$^{-3}$. The junction depth is 5.5 μm for the first through third RESURF regions 15, 16, and 17. The RESURF structure as described in the above embodiments facilitates raising of the electric field strength around both end portions thereof and, therefore, improving the carrier ejection effects.

The seventh embodiment exhibits the simulated ON-losses of $2.10 \times 10^{-6}$ J and the simulated turn-off losses of $1.63 \times 10^{-6}$ J. Therefore, the total losses are $3.73 \times 10^{-6}$ J. The power at the driving frequency 100 kHz is $3.73 \times 10^{-6} \times 10^5 = 0.373$ W. The breakdown voltage of the seventh embodiment is 641 V, which is lower by 19 V than the breakdown voltage of the fourth embodiment. The seventh embodiment, however, exhibits the total switching losses of 0.373 W, improving by 13% in comparison with the total switching losses in the fourth embodiment.

Figure 14:
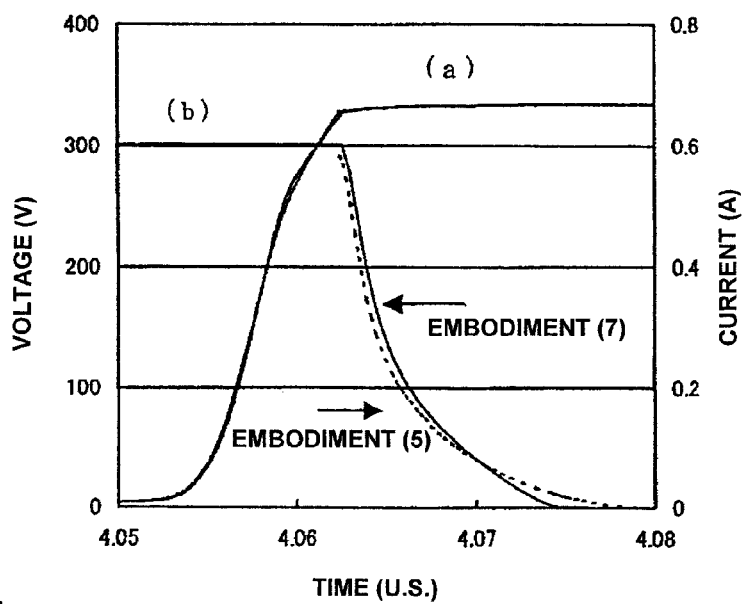
FIG. 14 illustrates the switching waveforms caused by the switching of the IGBTs of FIGS. 10 and 12.

FIG. 14 shows the switching waveforms caused by the switching of the fifth and seventh embodiments. The rising shape of the voltage waveform (a) according to the seventh embodiment is almost the same as the rising shape of the voltage waveform (a) according to the fifth embodiment. The tail of the current waveform (b) according to the seventh embodiment, however, is shorter than the tail of the current waveform (b) according to the fifth embodiment, by which the loss improvement is indicated. The current starts falling later in the seventh embodiment than in the fifth embodiment. The loss, which is the product of the voltage and the current, however, is reduced by the shortened tail of the current waveform (b) of the seventh embodiment. Thus, the switching losses can be further reduced by distributing the impurity concentration in the n-type RESURF region.

According to each of the first to seventh embodiments described above, the p-type well region 4 is spaced apart from the BOX layer 2 or 2-1. The p-type well region 4, however, can be in contact with the BOX layer 2 or 2-1 without any problem. When the p-type well region 4 is in contact with the BOX layer 2 or 2-1, no MOSFET is formed below the BOX layer 2 or 2-1 parallel to the IGBT. Therefore, when the p-type well region 4 is in contact with the BOX layer 2 or 2-1, the ON-resistance is a little bit higher than the ON-resistance of any of the fourth through seventh embodiments. When the p-type well region 4 is spaced apart from the BOX layer 2 or 2-1, it is desirable to set the distance between the p-type well region 4 and the BOX layer 2 or 2-1 to be short enough to surely prevent the holes, injected from the $p^+$-type anode region 6 to the n-type silicon active layer 3, from leaking to the substrate 1. In the SOI lateral IGBT according to any of the present embodiments described above, the p-type well region 4 can be formed more shallowly than the BOX layer 2 or 2-1 without any problem.

Figure 16A:
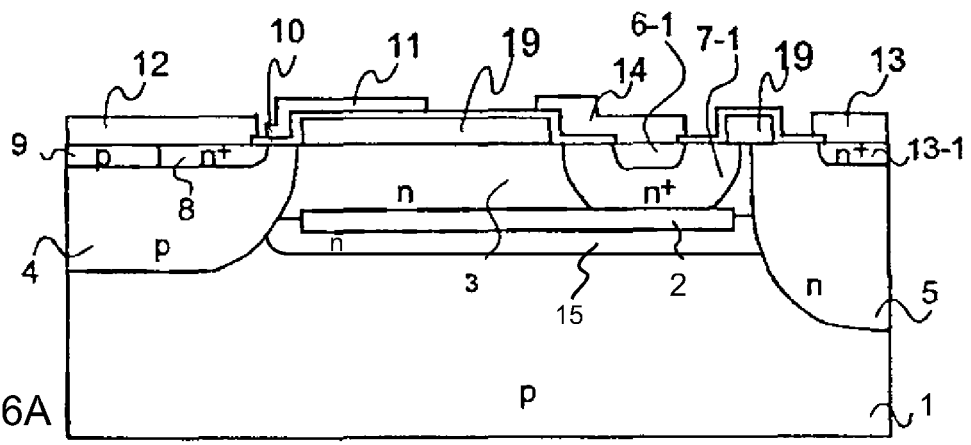
FIG. 16A schematically illustrates a cross-sectional view of an eighth embodiment of a SOI lateral IGBT according to the present invention.
Figure 16B:
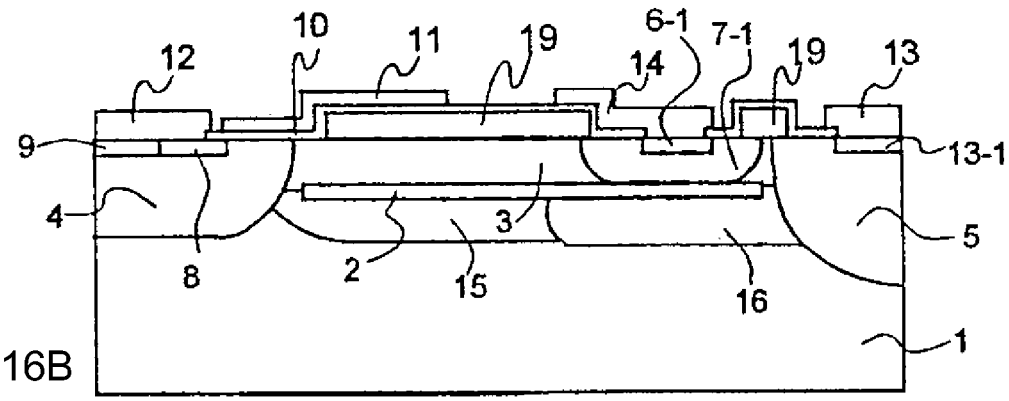
FIG. 16b schematically illustrates a cross-sectional view of a ninth embodiment of a SOI lateral IGBT according to the present invention.

In any of the fourth through seventh embodiments, the BOX layer 2 can be spaced apart from the n-type well region 5 without any problem in the same manner as the BOX layer 2-1 in the third embodiment (FIG. 6). For example, FIG. 16A and 16B, as the eight and ninth embodiments, are similar to the fourth embodiment (FIG. 7) and the sixth embodiment (FIG. 11), but the well region 5 is spaced from the BOX layer 2. According to any of the present embodiments described above, the thickness of the BOX layer 2 or 2-1 is set at 50 nm, which is the minimum thickness allowed to form by controlling the oxygen ion implantation amount and the thermal treatment conditions in the SIMOX method. Alternatively, BOX layer 2 or 2-1 can be as thick as several hundreds nm, which is the maximum thickness allowed to form by the SIMOX method.

In the SOI lateral IGBTs according to the present embodiments described above, the p-type silicon is used for a semiconductor of a first conductivity type and the n-type silicon for a semiconductor of a second conductivity type. Alternatively, the n-type silicon can be used for the semiconductor of the first conductivity type and the p-type silicon for the semiconductor of the second conductivity type without any problem. Silicon, SiC, diamond, and such a semiconductor crystal can be used without any problem.

The SOI lateral semiconductor device according to the present invention thus can facilitate a high breakdown voltage and low switching losses using a thin buried oxide film formed by a SIMOX method.

While the present invention has been particularly shown and described with reference to preferred embodiment thereof, it will be understood by those skilled in the art that the foregoing and other changes in form and details can be made therein without departing from the spirit and scope of the present invention. All modifications and equivalents attainable by one versed in the art from the present disclosure within the scope and spirit of the present invention are to be included as further embodiments of the present invention. The scope of the present invention accordingly is to be defined as set forth in the appended claims.

This application is based on, and claims priority to, JP PA 2006-107596 filed on 10 Apr. 2006. The disclosure of the priority application, in its entirety, including the drawings, claims, and the specification thereof, is incorporated herein by reference.

What is claimed is:

1. A SOI lateral semiconductor device comprising:
a semiconductor substrate of a first conductivity type;
a buried insulator film in the semiconductor substrate;
a very resistive active layer of a second conductivity type on the buried insulator film, the buried insulator film insulating and separating a major portion of the active layer from the semiconductor substrate;
a first semiconductor region of the first conductivity type formed adjacent to a first end of the active layer;
a second semiconductor region of the second conductivity type formed adjacent to a second end of the active layer, the second semiconductor region extending more deeply in the substrate than the buried insulator film;
a buffer region of the second conductivity type in the active layer, the buffer region being less electrically resistive than the active layer;
a third semiconductor region of the first conductivity type in the buffer region, the third semiconductor region extending from the surface of the buffer region toward the buried insulator film;
a fourth semiconductor region of the second conductivity type in a surface portion of the first semiconductor region;
a gate electrode over the first semiconductor region and extending between the fourth semiconductor region and the active layer with a gate oxide film beneath the gate electrode;
a metal electrode over and in contact with the third semiconductor region;
a metal electrode over the fourth semiconductor region; and
a metal electrode over and in contact with the second semiconductor region.

2. The SOI lateral semiconductor device according to claim 1, wherein the buried insulator film is 200 nm or less in thickness.

3. The SOI lateral semiconductor device according to claim 1, wherein the buried insulator film is formed by implanting oxygen ions.

4. The SOI lateral semiconductor device according to claim 1, wherein the third semiconductor region extends from the surface of the buffer region to the buried insulator film.

5. The SOI lateral semiconductor device according to claim 1, further including a fifth semiconductor region of the second conductivity type beneath the buried insulator film, wherein a first end of the fifth semiconductor region connects to the active layer and a second end thereof connects to the second semiconductor region.

6. The SOI lateral semiconductor device according to claim 4, further including a fifth semiconductor region of the second conductivity type beneath the buried insulator film, wherein a first end of the fifth semiconductor region connects to the active layer and a second end thereof connects to the second semiconductor region.

7. The SOI lateral semiconductor device according to claim 5, wherein the fifth semiconductor region exhibits an impurity concentration gradient.

8. The SOI lateral semiconductor device according to claim 6, wherein the fifth semiconductor region exhibits an impurity concentration gradient.

9. The SOI lateral semiconductor device according to claim 5, wherein the fifth semiconductor region comprises a plurality of regions extending between the first and second semiconductor regions, the impurity concentrations in the plurality of regions being different from each other.

10. The SOI lateral semiconductor device according to claim 6, wherein the fifth semiconductor region comprises a plurality of regions extending between the first and second semiconductor regions, the impurity concentrations in the plurality of regions being different from each other.

11. The SOI lateral semiconductor device according to claim 9, wherein the fifth semiconductor region comprises a first region extending from the first semiconductor region, a second region extending from the second semiconductor region, and a third region extending between the first and second regions, the impurity concentration in the third portion being greater than in the first or second region.

12. The SOI lateral semiconductor device according to claim 10, wherein the fifth semiconductor region comprises a first region extending from the first semiconductor region, a second region extending from the second semiconductor region, and a third region extending between the first and second regions, the impurity concentration in the third portion being greater than in the first or second region.

13. The SOI lateral semiconductor device according to claim 1, wherein the second semiconductor region is in contact with the buried insulator film.

14. The SOI lateral semiconductor device according to claim 4, wherein the second semiconductor region is in contact with the buried insulator film.

15. The SOI lateral semiconductor device according to claim 5, wherein the second semiconductor region is in contact with the buried insulator film.

16. The SOI lateral semiconductor device according to claim 6, wherein the second semiconductor region is in contact with the buried insulator film.

17. The SOI lateral semiconductor device according to claim 11, wherein the second semiconductor region is in contact with the buried insulator film.

18. The SOI lateral semiconductor device according to claim 12, wherein the second semiconductor region is in contact with the buried insulator film.

19. The SOI lateral semiconductor device according to claim 5, wherein the buried insulator film is spaced apart from the first and second semiconductor regions, and the fifth semiconductor region comprises a first end in contact with the active layer and a second end in contact with the second semiconductor region.

20. A method of forming a SOI lateral semiconductor device comprising the steps of:
providing a semiconductor substrate of a first conductivity type;
forming a buried insulator film in the semiconductor substrate;
forming a very resistive active layer of a second conductivity type on the buried insulator film, the buried insulator film insulating and separating a major part of the active layer from the semiconductor substrate;
forming a first semiconductor region of the first conductivity type adjacent to a first end of the active layer;
forming a second semiconductor region of the second conductivity type adjacent to a second end of the active layer, the second semiconductor region extending more deeply in the substrate than the buried insulator film;
forming a buffer region of the second conductivity type in the active layer, the buffer region being less electrically resistive than the active layer;
forming a third semiconductor region of the first conductivity type in the buffer region, the third semiconductor region extending from the surface of the buffer region toward the buried insulator film;
forming a fourth semiconductor region of the second conductivity type in a surface portion of the first semiconductor region;
forming a gate electrode over the first semiconductor region extending between the fourth semiconductor region and the active layer with a gate oxide film beneath the gate electrode;
forming a metal electrode over and in contact with the third semiconductor region;
forming a metal electrode over the fourth semiconductor region; and
forming a metal electrode over and in contact with the second semiconductor region.

* * * * *